(12) United States Patent
Choudhury et al.

(10) Patent No.: US 10,322,471 B2
(45) Date of Patent: Jun. 18, 2019

(54) LOW TEMPERATURE HIGH RELIABILITY ALLOY FOR SOLDER HIERARCHY

(71) Applicant: Alpha Assembly Solutions Inc., Waterbury, CT (US)

(72) Inventors: Pritha Choudhury, Waterbury, CT (US); Morgana De Avila Ribas, Waterbury, CT (US); Sutapa Mukherjee, Waterbury, CT (US); Siuli Sarkar, Waterbury, CT (US); Ranjit Pandher, Waterbury, CT (US); Ravindra Bhatkal, Waterbury, CT (US); Bawa Singh, Waterbury, CT (US)

(73) Assignee: Alpha Assembly Solutions Inc., Somerset, NJ (US)

(*) Notice: Subject to any disclaimer, the term of this patent is extended or adjusted under 35 U.S.C. 154(b) by 0 days.

(21) Appl. No.: 15/326,180

(22) PCT Filed: Jul. 15, 2015

(86) PCT No.: PCT/GB2015/052036
§ 371 (c)(1),
(2) Date: Jan. 13, 2017

(87) PCT Pub. No.: WO2016/012754
PCT Pub. Date: Jan. 28, 2016

(65) Prior Publication Data
US 2017/0197281 A1    Jul. 13, 2017

Related U.S. Application Data

(60) Provisional application No. 62/026,991, filed on Jul. 21, 2014.

(51) Int. Cl.
*B23K 31/02* (2006.01)
*B23K 35/26* (2006.01)
(Continued)

(52) U.S. Cl.
CPC ............ *B23K 35/262* (2013.01); *B23K 1/002* (2013.01); *B23K 1/0016* (2013.01);
(Continued)

(58) Field of Classification Search
CPC ............... B23K 35/262; B23K 35/025; B23K 35/0244; B23K 35/0238; B23K 35/0233;
(Continued)

(56) References Cited

U.S. PATENT DOCUMENTS

| 6,367,683 B1 * | 4/2002 | Rass | B23K 35/26 228/111.5 |
| 9,802,275 B2 * | 10/2017 | Ribas | B23K 35/362 |

(Continued)

FOREIGN PATENT DOCUMENTS

| EP | 2147740 A1 * | 1/2010 | B23K 35/025 |
| JP | 2002-096191 | 4/2002 | |

(Continued)

*Primary Examiner* — Kiley S Stoner
(74) *Attorney, Agent, or Firm* — Carmody Torrance Sandak & Hennessey LLP

(57) ABSTRACT

A lead-free, antimony-free solder alloy suitable for use in electronic soldering applications. The solder alloy comprises (a) from 1 to 4 wt. % silver; (b) from 0.5 to 6 wt. % bismuth; (c) from 3.55 to 15 wt. % indium, (d) 3 wt. % or less of copper; (e) one or more optional elements and the balance tin, together with any unavoidable impurities.

21 Claims, 4 Drawing Sheets

(51) Int. Cl.
*B23K 35/00* (2006.01)
*C22C 13/00* (2006.01)
*C22C 13/02* (2006.01)
*B23K 1/00* (2006.01)
*B23K 1/002* (2006.01)
*B23K 1/005* (2006.01)
*B23K 1/08* (2006.01)
*B23K 35/02* (2006.01)
*H01L 23/00* (2006.01)
*B23K 101/40* (2006.01)
*B23K 101/42* (2006.01)

(52) U.S. Cl.
CPC .......... *B23K 1/0056* (2013.01); *B23K 1/085* (2013.01); *B23K 35/00* (2013.01); *B23K 35/025* (2013.01); *B23K 35/0222* (2013.01); *B23K 35/0227* (2013.01); *B23K 35/0233* (2013.01); *B23K 35/0238* (2013.01); *B23K 35/0244* (2013.01); *B23K 35/26* (2013.01); *C22C 13/00* (2013.01); *C22C 13/02* (2013.01); *H01L 24/29* (2013.01); *H01L 24/83* (2013.01); *B23K 2101/40* (2018.08); *B23K 2101/42* (2018.08); *H01L 2224/2916* (2013.01); *H01L 2224/2918* (2013.01); *H01L 2224/29101* (2013.01); *H01L 2224/29105* (2013.01); *H01L 2224/29109* (2013.01); *H01L 2224/29111* (2013.01); *H01L 2224/29113* (2013.01); *H01L 2224/29117* (2013.01); *H01L 2224/29123* (2013.01); *H01L 2224/29124* (2013.01); *H01L 2224/29138* (2013.01); *H01L 2224/29139* (2013.01); *H01L 2224/29144* (2013.01); *H01L 2224/29147* (2013.01); *H01L 2224/29149* (2013.01); *H01L 2224/29155* (2013.01); *H01L 2224/29157* (2013.01); *H01L 2224/29163* (2013.01); *H01L 2224/29166* (2013.01); *H01L 2224/29169* (2013.01); *H01L 2224/29171* (2013.01); *H01L 2224/29172* (2013.01); *H01L 2224/83815* (2013.01); *H01L 2924/0102* (2013.01); *H01L 2924/01015* (2013.01); *H01L 2924/01032* (2013.01); *H01L 2924/01034* (2013.01); *H01L 2924/01052* (2013.01); *H01L 2924/01058* (2013.01)

(58) Field of Classification Search
CPC ............. B23K 35/0227; B23K 35/26; B23K 35/0222; B23K 1/085; B23K 1/0056; B23K 1/002; B23K 1/0016; B23K 35/00; B23K 2201/40; B23K 2201/42; H01L 24/29; H01L 24/83; H01L 2224/29149; H01L 2224/29147; H01L 2224/29144; H01L 2224/29139; H01L 2224/29138; H01L 2224/29124; H01L 2224/29123; H01L 2224/29113; H01L 2224/29111; H01L 2224/29109; H01L 2224/29105; H01L 2224/29101; H01L 2924/01052; H01L 2924/01058; H01L 2924/01034; H01L 2924/01032; H01L 2924/0102; H01L 2924/01015; H01L 2224/83815; H01L 2224/2918; H01L 2224/29171; H01L 2224/29169; H01L 2224/29166; H01L 2224/29172; H01L 2224/29163; H01L 2224/2916; H01L 2224/29157; H01L 2224/29155; H01L 2224/29117; C22C 13/00; C22C 13/02; H05K 999/99
See application file for complete search history.

(56) References Cited

U.S. PATENT DOCUMENTS

| | | | |
|---|---|---|---|
| 2003/0015575 A1 | 1/2003 | Yamaguchi et al. | |
| 2007/0134125 A1* | 6/2007 | Liu | C22C 13/00 420/560 |
| 2008/0292492 A1* | 11/2008 | Ingham | B23K 35/262 420/561 |
| 2010/0307823 A1* | 12/2010 | Kawamata | B23K 35/26 174/84 R |
| 2011/0120769 A1* | 5/2011 | Sakatani | B23K 35/262 174/84 R |
| 2012/0292087 A1 | 11/2012 | Ueshima et al. | |
| 2013/0327444 A1* | 12/2013 | Sawamura | B23K 35/025 148/24 |
| 2014/0037369 A1* | 2/2014 | Nishimura | C22C 13/00 403/272 |
| 2014/0219711 A1* | 8/2014 | Pandher | B23K 35/262 403/272 |
| 2015/0136461 A1* | 5/2015 | Imamura | B23K 1/00 174/259 |
| 2015/0183062 A1* | 7/2015 | Imamura | B23K 1/00 174/257 |
| 2015/0224604 A1* | 8/2015 | Choudhury | B23K 1/0016 403/272 |
| 2015/0305167 A1* | 10/2015 | Nakanishi | C22C 13/00 174/257 |
| 2015/0328722 A1* | 11/2015 | Suzuki | B23K 35/26 403/272 |
| 2016/0271737 A1* | 9/2016 | Ikeda | B23K 35/3618 |
| 2016/0318134 A1* | 11/2016 | Ribas | B23K 35/262 |
| 2017/0304955 A1* | 10/2017 | Pandher | B23K 1/0056 |

FOREIGN PATENT DOCUMENTS

| | | | |
|---|---|---|---|
| JP | 4787384 B1 * | 10/2011 | .......... B23K 35/025 |
| JP | 2012106280 A * | 6/2012 | .......... B23K 35/025 |
| KR | 20030003030 A * | 1/2003 | .......... B23K 1/0016 |
| KR | 10-2013-0083663 | 7/2013 | |

* cited by examiner

LOW TEMPERATURE HIGH RELIABILITY ALLOY FOR SOLDER HIERARCHY

FIELD OF THE INVENTION

The present invention relates generally to the field of metallurgy and to an alloy and, in particular, a lead-free and antimony-free solder alloy. The alloy is particularly, though not exclusively, suitable for use in electronic soldering applications such as wave soldering, surface mounting technology, hot air leveling and ball grid arrays, land grid arrays, bottom terminated packages, LEDs and chip scale packages.

BACKGROUND OF THE INVENTION

Wave soldering (or flow soldering) is a widely used method of mass soldering electronic assemblies. It may be used, for example, for through-hole circuit boards, where the board is passed over a wave of molten solder, which laps against the bottom of the board to wet the metal surfaces to be joined. Another soldering technique involves printing of the solder paste on the soldering pads on the printed circuit boards followed by placement and sending the whole assembly through a reflow oven. During the reflow process, the solder melts and wets the soldering surfaces on the boards as well as the components. Another soldering process involves immersing printed wiring boards into molten solder in order to coat the copper terminations with a solderable protective layer. This process is known as hot-air leveling. A ball grid array joint or chip scale package is assembled typically with spheres of solder between two substrates. Arrays of these joints are used to mount chips on circuit boards.

As use of lead-free soldering materials becomes widespread, either due to environmental directives or pressure from the end users, so does the range of applications for such materials. High Ag solder alloys, such as SnAg3.0Cu0.5, have the benefits of excellent mechanical properties and good thermal reliability. However, the melting point of such alloys is about 217-221° C. This higher melting point requires reflow temperature of about 240-250° C., which may in certain cases be damaging to the printed circuit boards (PCBs) and electronic components.

There is a need for a lead-free solder alloy having a lower melting point than that of conventional high silver alloys, but with similar or more favourable mechanical and thermal properties.

The present invention aims to solve at least some of the problems associated with the prior art or to provide a commercially acceptable alternative.

Accordingly, in a first aspect, the present invention provides a lead-free, antimony-free solder alloy comprising:
(a) from 1 to 4 wt. % silver
(b) from 0.5 to 6 wt. % bismuth
(c) from 3.55% to 15 wt. % indium
(d) 3 wt. % or less of copper
(e) optionally one or more of the following elements
0 to 1 wt. % nickel
0 to 1 wt. % of titanium
0 to 1 wt. % manganese
0 to 1 wt. % of rare earths, such as cerium
0 to 1 wt. % of chromium
0 to 1 wt. % germanium
0 to 1 wt. % of gallium
0 to 1 wt. % of cobalt
0 to 1 wt. % of iron
0 to 1 wt. % of aluminum
0 to 1 wt. % of phosphorus
0 to 1 wt. % of gold
0 to 1 wt. % of tellurium
0 to 1 wt. % of selenium
0 to 1 wt. % of calcium
0 to 1 wt. % of vanadium
0 to 1 wt. % of molybdenum
0 to 1 wt. % of platinum
0 to 1 wt. % of magnesium
(f) the balance tin, together with any unavoidable impurities.

DETAILED DESCRIPTION OF THE PREFERRED EMBODIMENTS

Figure 1:
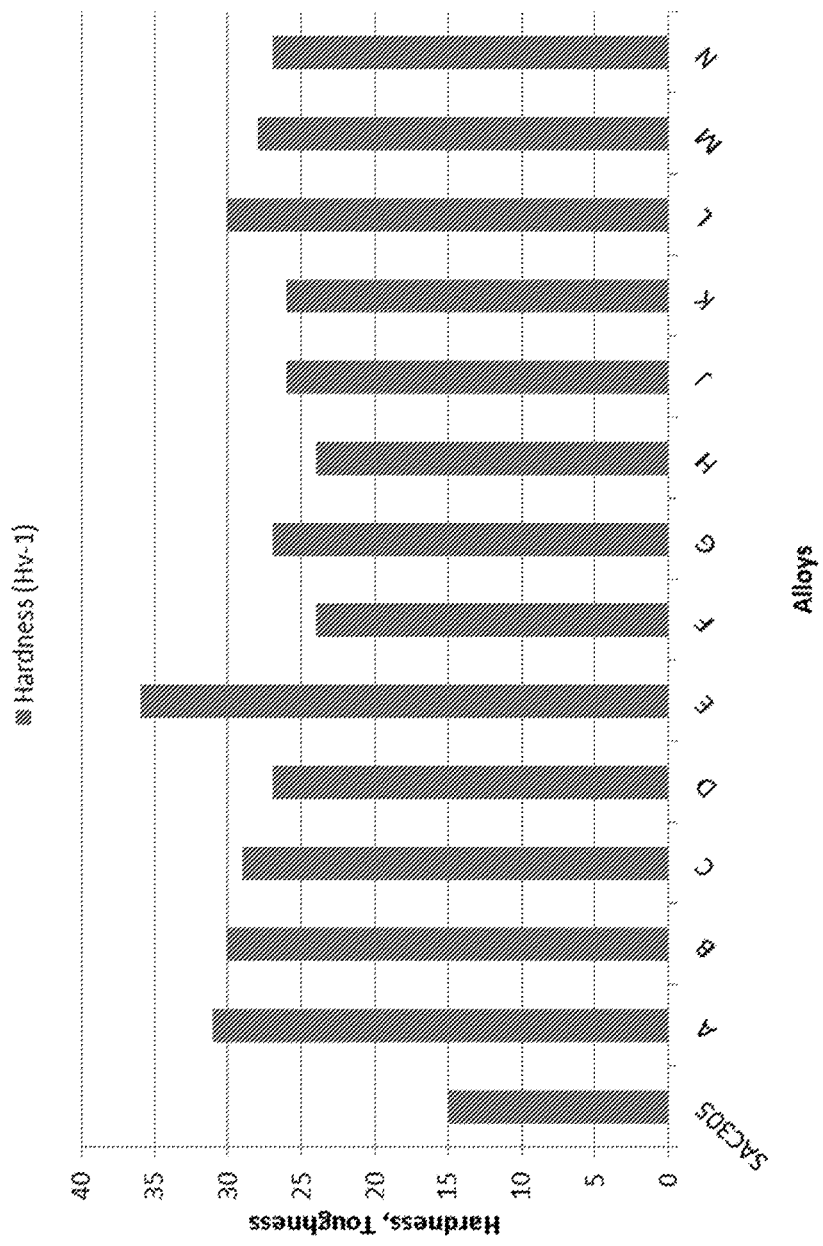
FIG. 1 shows Vickers hardness (Hv-1) values for a prior art alloy and alloys according to the present invention.

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being preferred or advantageous.

The term "solder alloy" used herein encompasses a fusible metal alloy with a melting point in the range of from 90 to 400° C.

The alloys described herein exhibit improved high-temperature reliability and are capable of withstanding operational temperatures of typically at least 125° C.

The alloys have relatively low melting points, more specifically low liquidus temperatures, typically a liquidus temperature of 215° C. or less, more typically less than 210° C., even more typically less than 205° C. This enables the alloys to be used in a low temperature reflow process, for example a reflow process at from 210 to 230° C. Such a low temperature reflow process may be less likely to result in damage to solder components compared with conventional reflow processes.

The alloys may advantageously be used in a soldering method employing multiple reflow processes on a single board. For example, in a first reflow process, all electronic components that can tolerate higher reflow temperatures could be soldered to a board using standard alloys such as, for example, SnAg3.0Cu0.5. In a second reflow process, temperature sensitive components could be processed using the alloys of the present invention.

The alloys may exhibit improved mechanical properties and mechanical reliability. The mechanical properties, mechanical reliability and thermal reliability may be similar to, or more favourable than, that of conventional high silver solder alloys such as, for example, SnAg3.0Cu0.5.

The alloys may exhibit improved thermal shock performance. For example, they survive an IPC-9701 thermal cycling test of over 2000 cycles of from −40° C. to +125° C. with a dwell time of 10 minutes at each temperature.

The alloys are lead-free and antimony-free meaning that no lead or antimony is added intentionally. Thus, the lead and antimony contents are zero or at no more than accidental impurity levels.

The alloy composition comprises from 1 to 4 wt. % silver. Preferably the alloy comprises from 1.2 to 3.8 wt. % silver, more preferably from 2.5 to 3.5 wt. % silver, even more preferably from 2.75 to 3.76 wt. % silver, still even more preferably from 2.75 to 3.75 wt. % silver. The presence of silver in the specified amount may serve to improve mechanical properties, for example strength, through the formation of intermetallic compounds. In addition, the presence of silver may act to improve wetting and spread.

The alloy composition comprises from 0.5 to 6 wt. % bismuth. Preferably, the alloy comprises from 1.5 to 5.5 wt. % bismuth, more preferably from 2 to 5 wt. % bismuth, even more preferably from 2.5 to 5 wt. % bismuth, still even more preferably from 2.5 to 4.5 wt. % bismuth. The presence of bismuth in the specified amount may serve to improve mechanical properties through solid solution strengthening. Bismuth may also act to improve creep resistance. Bismuth may also improve wetting and spread.

The alloy composition comprises from 3.55 to 15 wt. % indium. The alloy preferably comprises from 3.6 to 12 wt. %, more preferably from 3.65 to 12 wt. %, even more preferably from 3.7 to 11 wt. % indium, still even more preferably from 4 to 10.5 wt. % indium, still even more preferably from 4.50 to 10 wt. % indium. The alloy may preferably comprise from 3.7 to 10 wt. % indium. Alternatively, the alloy preferably comprises from 3.6 to 8 wt. % indium, more preferably from 3.65 to 7 wt. % indium, even more preferably from 3.7 to 6.7 wt. % indium, still even more preferably from 4 to 6.5 wt. % indium. The presence of indium may act to improve mechanical properties through solid solution strengthening. The presence of indium in the recited amounts, together with the other alloy elements, may also serve to reduce the liquidus temperature of the alloy. In an alternative aspect, the alloy may comprise up to 25 wt. % indium.

The alloy composition comprises 3 wt. % or less of copper, for example from 0.1 to 3 wt. %. Preferably, the alloy comprises from 0.01 to 3 wt. % copper, more preferably from 0.1 to 1 wt. % copper, even more preferably from 0.4 to 0.8 wt. % copper, still even more preferably from 0.4 to 0.75 wt. % copper. The presence of copper in the specified amount may serve to improve mechanical properties, for example strength, through the formation of intermetallic compounds. In addition, the presence of copper reduces copper dissolution and may also improve creep resistance.

The alloy composition optionally comprises from 0 to 1 wt. % of nickel, for example from 0.01 to 1 wt. %. If nickel is present, the alloy preferably comprises from 0.01 to 1 wt. % nickel, more preferably from 0.03 to 0.6 wt. % nickel, even more preferably from 0.05 to 0.5 wt. % nickel, still even more preferably from 0.08 to 0.25 wt. % nickel. The presence of nickel in the specified amount may serve to improve mechanical properties through the formation of intermetallic compounds with tin, which can result in precipitation strengthening. Nickel may also increase drop shock resistance by decreasing IMC growth at the substrate/solder interface.

The alloy composition optionally comprises 0 to 1 wt. % of titanium, for example from 0.005 to 1 wt. %. If titanium is present, the alloy preferably comprises from 0.005 to 0.5 wt. % titanium, more preferably from 0.007 to 0.1 wt. % titanium, even more preferably from 0.008 to 0.06 wt. % titanium, and most preferably 0.01 to 0.05 wt. % titanium. The presence of titanium in the specified amount may serve to improve strength and interfacial reactions. Titanium may also improve drop shock performance by controlling copper diffusion at the substrate/solder interface.

The alloy composition optionally comprises 0 to 1 wt. % of manganese, for example from 0.005 to 1 wt. %. If manganese is present, the alloy preferably comprises from 0.005 to 0.5 wt. % manganese, more preferably from 0.007 to 0.1 wt. % manganese, even more preferably from 0.008 to 0.06 wt. % manganese and most preferably 0.01 to 0.05 wt. % manganese. The presence of manganese in the specified amount may serve to improve strength and interfacial reactions. Manganese may also improve drop shock performance.

The alloy composition optionally comprises 0 to 1 wt. % of cobalt, for example from 0.01 to 1 wt. %. If cobalt is present, the alloy preferably comprises from 0.01 to 0.6 wt. % cobalt, more preferably from 0.02 to 0.5 wt. % cobalt, even more preferably from 0.03 to 0.4 wt. % cobalt, and most preferably 0.04 to 0.3 wt. % cobalt. Cobalt may also slow the rate of IMC formation at the substrate/solder interface, and increase drop-shock resistance.

The alloy may optionally also contain one or more of 0.005 to 1 wt. % of aluminum, 0.005 to 1 wt. % of calcium, 0.005 to 1 wt. % of germanium, 0.005 to 1 wt. % of magnesium, 0.005 to 1 wt. % of phosphorus, 0.005 to 1 wt. % of vanadium. Such elements may serve as deoxidisers. The presence of such elements may improve wettability of the alloy.

The alloy may optionally also contain one or more of 0.005 to 1 wt. % of gold, 0.005 to 1 wt. % of chromium, 0.005 to 1 wt. % of iron, 0.005 to 1 wt. % of molybdenum, 0.005 to 1 wt. % of platinum, 0.005 to 1 wt. % of tellurium, 0.005 to 1 wt. % of selenium. Such elements may serve as deoxidisers. Such elements may serve to improve strength and interfacial reactions The alloy may optionally contain 0.005 to 1 wt. % of rare earth element(s). Rare earths may act to improve spread and wettability. Cerium has been found to be particularly effective in this regard.

The term rare earth element as used herein refers to one or more elements selected from Sc, Y, La, Ce, Pr, Nd, Pm, Sm, Eu, Gd, Tb, Dy, Ho, Er, Tm, Yb and Lu.

The alloy will typically comprise at least 74 wt. % tin, more typically at least 80 wt. % tin, still more typically at least 85 wt. % tin.

In one embodiment, there is provided an alloy comprising from 2 to 4 wt. % silver, from 1 to 6 wt. % bismuth, from 0.1 to 1.5 wt. % copper, from 3.65 to 4.5 wt. % indium, 0.05 to 0.25 wt. % of nickel and the balance tin. Such an alloy may exhibit a particularly favourable combination of a low liquidus temperature together with favourable thermal and mechanical properties. For example, the alloy may typically exhibit a liquidus temperature of 210° C. or less together with an ultimate tensile strength of greater than or equal to 100 MPa.

In a further embodiment, there is provided an alloy comprising from 3 to 4.5 wt. % silver, from 3 to 4.5 wt. % bismuth, from 3 to 4.5% indium, from 0.1 to 1.5 wt. % of copper, from 0.05 to 0.25 wt. % of nickel. Such an alloy has liquidus temperature of 209.2° C. In one specific example of this embodiment, the alloy comprises approximately 3.5 wt. % silver, 4 wt. % bismuth, 0.7 wt. % copper, 3.7 wt. % indium, 0.2 wt. % nickel and the balance tin together with unavoidable impurities.

In a further embodiment, there is provided an alloy comprising from 2.5 to 4 wt. % silver, from 4 to 5.5 wt. % bismuth, from 3 to 4.5% indium, from 0.1 to 1.5 wt. % copper and from 0.05 to 0.25 wt. % of nickel. Such an alloy has a liquidus temperature of 208.1° C. In one specific example of this embodiment, the alloy comprises approximately 3 wt. % silver, 5 wt. % bismuth, 0.7 wt. % copper, 3.75 wt. % indium, 0.1 wt. % nickel and the balance tin together with unavoidable impurities.

In a further embodiment, there is provided an alloy comprising from 1 to 2 wt. % silver, from 4 to 5.5 wt. % bismuth, from 3 to 4.5% indium, from 0.1 to 1.5 wt. % copper and from 0.05 to 0.25 wt. % nickel. Such an alloy has a liquidus temperature of 215° C. In one specific embodiment of this embodiment, the alloy comprises approximately 1.5 wt. % silver, 5 wt. % bismuth, 0.7 wt. % copper, 3.75 wt. % indium, 0.16 wt. % nickel and the balance tin together with unavoidable impurities.

In a further embodiment, there is provided an alloy comprising from 2.5 to 4 wt. % silver, from 1 to 2 wt. % bismuth, from 3 to 4.5% indium and from 0.1 to 1.5 wt. % copper. Such alloy has a liquidus temperature of 213° C. In one specific example of this embodiment, the alloy comprises approximately 3 wt. % silver, 0.9 wt. % bismuth, 0.5 wt. % copper, 3.6 wt. % indium, and the balance tin together with unavoidable impurities.

In a further embodiment, there is provided an alloy comprising from 2.5 to 4 wt. % silver, from 1 to 2 wt. % bismuth, from 4 to 5.5% indium, from 0.1 to 1.5 wt. % copper and from 0.05 to 0.25 wt. % of nickel. Such an alloy has a liquidus temperature of 210.5° C. In one specific example of this embodiment, the alloy comprises approximately 3 wt. % silver, 1 wt. % bismuth, 0.5 wt. % copper, 4.6 wt. % indium, 0.11 wt. % nickel, and the balance tin together with unavoidable impurities.

In a further embodiment, there is provided an alloy comprising from 2.5 to 4 wt. % of silver, from 2.5 to 4 wt. % bismuth, from 3.5 to 5% indium, from 0.1 to 1.5 wt. % copper and from 0.05 to 0.25 wt. % of nickel. Such an alloy has a liquidus temperature of 210.2° C. In one specific example of this embodiment, the alloy comprises approximately 3 wt. % silver, 3 wt. % bismuth, 0.5 wt. % copper, 4 wt. % indium, 0.2 wt. % nickel, and the balance tin together with unavoidable impurities.

In a further embodiment, there is provided an alloy comprising from 2.5 to 4 wt. % silver, from 2.5 to 4 wt. % bismuth, from 4 to 5.5% indium, from 0.1 to 1.5 wt. % copper and from 0.05 to 0.25 wt. % nickel. Such an alloy has a liquidus temperature of 207.9° C. In one specific example of this embodiment, the alloy comprises approximately 3 wt. % silver, 2.9 wt. % bismuth, 0.5 wt. % copper, 4.75 wt. % indium, 0.11 wt. % nickel, and the balance tin together with unavoidable impurities.

In a further embodiment, there is provided an alloy comprising from 2.5 to 4 wt. % silver, from 2.5 to 4 wt. % bismuth, from 5 to 6.5% indium, from 0.1 to 1.5 wt. % copper and from 0.05 to 0.25 wt. % nickel. Such alloy has a liquidus temperature of 206.5° C. In one specific example of this embodiment, the alloy comprises approximately 3 wt. % silver, 3 wt. % bismuth, 0.5 wt. % copper, 6 wt. % indium, 0.1 wt. % nickel, and the balance tin together with unavoidable impurities.

In a further embodiment, there is provided an alloy comprising from 2.5 to 4 wt. % silver, from 2.5 to 4 wt. % bismuth, from 5 to 6.5% indium, from 0.1 to 1.5 wt. % copper, from 0.05 to 0.25 wt. % nickel and from 0.001 to 0.05 wt. % manganese. Such an alloy has a liquidus temperature of 207.6° C. In one specific example of this embodiment, the alloy comprises approximately 3 wt. % silver, 3 wt. % bismuth, 0.5 wt. % copper, 6 wt. % indium, 0.15 wt. % nickel, 0.022 wt. % manganese and the balance tin together with unavoidable impurities.

In a further embodiment, there is provided an alloy comprising from 2.5 to 4 wt. % silver, from 2.5 to 4 wt. % bismuth, from 10 to 13% indium, from 0.1 to 1.5 wt. % copper and from 0.001 to 0.01 wt. % Ge. Such an alloy has a liquidus temperature of 196° C. In one specific example of this embodiment, the alloy comprises approximately 3 wt. % silver, 3 wt. % bismuth, 0.6 wt. % copper, 12 wt. % indium, 0.005 wt. % germanium and the balance tin together with unavoidable impurities.

In a further embodiment, there is provided an alloy comprising from 1.5 to 3 wt. % silver, from 2.5 to 4 wt. % bismuth, from 9 to 11% indium, from 0.1 to 1.5 wt. % copper, and from 0.001 to 0.05 wt. % Co. Such an alloy has a liquidus temperature of 202° C. In one specific example of this embodiment, the alloy comprises approximately 2 wt. % silver, 3 wt. % bismuth, 0.7 wt. % copper, 10 wt. % indium, 0.03 wt. % cobalt and the balance tin together with unavoidable impurities.

In a further embodiment, there is provided an alloy comprising from 3 to 4 wt. % silver, from 4 to 5 wt. % bismuth, from 3 to 4% indium, from 0.1 to 1.0 wt. % copper. Such an alloy has a liquidus temperature of 208° C. In one specific example of this embodiment, the alloy comprises approximately 3.6 wt. % silver, 4 wt. % bismuth, 0.4 wt. % copper, 4 wt. % indium and the balance tin together with unavoidable impurities.

In further embodiment, there is provided an alloy comprising 3 to 4 wt. % silver, from 2 to 3 wt. % bismuth, from 6 to 7 wt. % indium, from 0.1 to 1 wt. % copper. Such an alloy has a liquidus temperature of 208° C., In one specific example of this embodiment, the alloy comprises approximately 3.6 wt. % silver, 3 wt. % bismuth, 6 wt. % indium, 0.4 wt. % copper and the balance tin together with unavoidable impurities.

In further embodiment, there is provided an alloy comprising 3 to 4 wt. % silver, from 2 to 4 wt. % bismuth, from 7 to 8 wt. % indium, from 0.1 to 1 wt. % copper. Such an alloy has a liquidus temperature of 201° C. In one specific example of this embodiment, the alloy comprises approximately 3.5 wt. % silver, 4 wt. % bismuth, 8 wt. % indium, 0.4 wt. % copper and the balance tin together with unavoidable impurities.

In a particularly preferred further embodiment, there is provided an alloy comprising from 2.5 to 3.5 wt. % silver, from 2.5 to 3.5 wt. % bismuth, from 5.5 to 6.5% indium, from 0.3 to 0.7 wt. % copper, from 0.05 to 0.25 wt. % nickel and from 0.005 to 0.05 wt. % manganese. The alloy may exhibit a particularly favourable combination of low melting point, excellent mechanical properties and excellent thermal cycling properties.

In a particularly preferred further embodiment, there is provided an alloy comprising from 2.5 to 3.5 wt. % silver, from 2.5 to 3.5 wt. % bismuth, from 7 to 9 indium, from 0.3 to 0.8 wt. % copper and from 0.005 to 0.05 wt. % titanium. The alloy may exhibit a particularly favourable combination of low melting point, excellent mechanical properties and excellent thermal cycling properties.

In a particularly preferred further embodiment, there is provided an alloy comprising from 2.5 to 3.5 wt. % silver, from 2.5 to 3.5 wt. % bismuth, from 9 to 11% indium, from 0.3 to 0.8 wt. % copper and from 0.005 to 0.05 wt. % manganese. The alloy may exhibit a particularly favourable combination of low melting point, excellent mechanical properties and excellent thermal cycling properties.

In a particularly preferred further embodiment, there is provided an alloy comprising from 2.5 to 3.5 wt. % silver, from 2.5 to 3.5 wt. % bismuth, from 11 to 13% indium and from 0.3 to 0.8 wt. % copper. The alloy may exhibit a particularly favourable combination of low melting point, excellent mechanical properties and excellent thermal cycling properties.

In a particularly preferred further embodiment, there is provided an alloy comprising from 2.5 to 3.5 wt. % silver, from 2.5 to 3.5 wt. % bismuth, from 5.5 to 6.5% indium, from 0.3 to 0.8 wt. % copper, from 0.05 to 0.4 wt. % nickel, from 0.005 to 0.05 wt. % manganese and from 0.01 to 0.15 wt. % phosphorous. The alloy may exhibit a particularly favourable combination of low melting point, excellent mechanical properties and excellent thermal cycling properties.

In a particularly preferred further embodiment, there is provided an alloy comprising from 2.5 to 3.5 wt. % silver, from 2.5 to 3.5 wt. % bismuth, from 5.5 to 6.5% indium, from 0.3 to 7 wt. % copper, from 0.05 to 0.25 wt. % nickel and from 0.001 to 0.03 wt. % germanium. The alloy may exhibit a particularly favourable combination of low melting point, excellent mechanical properties and excellent thermal cycling properties.

In a further aspect, the present invention provides a lead-free, antimony-free solder alloy comprising:
(a) 10 wt. % or less of silver
(b) 10 wt. % or less of bismuth
(c) greater than 0.5 wt. % of gallium
(d) 12 wt. % or less of indium
(e) optionally one or more of the following elements
2 wt. % or less of copper
0 to 1 wt. % nickel
0 to 1 wt. % of titanium
0 to 1 wt. % manganese
0 to 1 wt. % of rare earths, such as cerium
0 to 1 wt. % of chromium
0 to 1 wt. % germanium
0 to 1 wt. % of cobalt
0 to 1 wt. % of iron
0 to 1 wt. % of aluminum
0 to 1 wt. % of phosphorus
0 to 1 wt. % of gold
0 to 1 wt. % of tellurium
0 to 1 wt. % of selenium
0 to 1 wt. % of calcium
0 to 1 wt. % of vanadium
0 to 1 wt. % of molybdenum
0 to 1 wt. % of platinum
0 to 1 wt. % of magnesium
(g) the balance tin, together with any unavoidable impurities.

Such an alloy has a low liquidus temperature and favourable thermal and mechanical properties.

The preferred silver, bismuth, copper and optional element contents of the first aspect of the present invention apply also to this aspect.

The alloy may comprise from 1 to 10 wt. % silver and/or from 0.5 to 10 wt. % bismuth and/or from 0.5 to 3 wt. % of gallium and/or from 3.55 to 12 wt. % indium.

The alloy comprises greater than 0.5 wt. % gallium, for example from 0.5 to 2.5 wt. % gallium. The alloy preferably comprises from 0.7 to 2.1 wt. % gallium, more preferably from 0.8 to 2.05 wt. % gallium. Gallium in the recited ranges may serve to reduce the liquidus temperature of the alloy. The alloy may comprise 10 wt. % or less indium, for example from 2 to 3.5 wt. % indium, or 2.5 to 5.5 wt. % indium, or 2.5 to 10 wt. % indium, or 3.5 to 10 wt. % indium. In an alternative aspect, the alloy may comprise 3 wt. % or less copper.

In one embodiment, there is provided an alloy comprising from 2.5 to 4 wt. % silver, from 3.5 to 4.5 wt. % bismuth, from 2 to 3.5% indium, from 0.1 to 1.5 wt. % copper, from 0.05 to 0.25 wt. % nickel and from 1 to 2 wt. % Ga. Such an alloy has a liquidus temperature of 206.9° C. In one specific example of this embodiment, the alloy comprises approximately 3 wt. % silver, 4 wt. % bismuth, 0.7 wt. % copper, 2.94 wt. % indium, 0.2 wt. % nickel, 1.14 wt. % gallium and the balance tin together with unavoidable impurities.

In a further embodiment, there is provided an alloy comprising 2.5 to 4 wt. % silver, from 1 to 3 wt. % bismuth, from 2.5 to 5.5% indium, from 0.1 to 1.5 wt. % copper, and from 0.5 to 2 wt. % Ga. Such an alloy has a liquidus temperature of 207.2° C. In one specific example of this embodiment, the alloy comprises approximately 3 wt. % silver, 1 wt. % bismuth, 0.6 wt. % copper, 5 wt. % indium, 1.55 wt. % gallium and the balance tin together with unavoidable impurities.

In a further embodiment, there is provided an alloy comprising 2.5 to 4 wt. % silver, from 1 to 4 wt. % bismuth, from 2.5 to 10% indium and from 0.5 to 3 wt. % Ga. Such an alloy has a liquidus temperature of 199.6° C. In one specific example of this embodiment, the alloy comprises approximately 3 wt. % silver, 3 wt. % bismuth, 7.76 wt. % indium, 2.03 wt. % gallium and the balance tin together with unavoidable impurities.

In a further embodiment, there is provided an alloy comprising 1.5 to 4 wt. % silver, from 1 to 4 wt. % bismuth, from 3.5 to 10% indium, from 0.5 to 3 wt. % Ga and from 0.005 to 0.1 wt. % manganese. Such an alloy has a liquidus temperature of 203° C. In one specific example of this embodiment, the alloy comprises approximately 2 wt. % silver, 3 wt. % bismuth, 8 wt. % indium, 1 wt. % gallium, 0.01 wt. % manganese and the balance tin together with unavoidable impurities.

In a further aspect, the present invention provides a lead-free, antimony-free solder alloy comprising:
(a) 10 wt. % or less of silver
(b) 10 wt. % or less of bismuth
(c) 3 wt. % or less of copper
(d) 10 wt. % or less indium
(e) greater than 0.5 wt. % of gallium
(f) optionally one or more of the following elements
0 to 1 wt. % nickel
0 to 1 wt. % of titanium
0 to 1 wt. % manganese
0 to 1 wt. % of rare earths, such as cerium
0 to 1 wt. % of chromium
0 to 1 wt. % germanium
0 to 1 wt. % of cobalt
0 to 1 wt. % of iron
0 to 1 wt. % of aluminum
0 to 1 wt. % of phosphorus
0 to 1 wt. % of gold
0 to 1 wt. % of tellurium
0 to 1 wt. % of selenium
0 to 1 wt. % of calcium
0 to 1 wt. % of vanadium
0 to 1 wt. % of molybdenum
0 to 1 wt. % of platinum
0 to 1 wt. % of magnesium
(g) the balance tin, together with any unavoidable impurities.

The preferably element contents of the first aspect may also apply to this aspect.

In a further aspect, the present invention provides a lead-free, antimony-free solder alloy comprising:
(a) 10 wt. % or less of silver
(b) 10 wt. % or less of bismuth
(c) 25 wt. % or less of indium
(d) optionally one or more of the following elements:
0 to 3 wt. % Cu
0 to 1 wt. % nickel
0 to 1 wt. % of titanium
0 to 1 wt. % manganese
0 to 1 wt. % of rare earths, such as cerium
0 to 1 wt. % of chromium
0 to 1 wt. % germanium
0 to 1 wt. % of cobalt
0 to 1 wt. % of iron
0 to 1 wt. % of aluminum
0 to 1 wt. % of phosphorus
0 to 1 wt. % of gold
0 to 1 wt. % of tellurium
0 to 1 wt. % of selenium
0 to 1 wt. % of calcium
0 to 1 wt. % of vanadium
0 to 1 wt. % of molybdenum
0 to 1 wt. % of platinum
0 to 1 wt. % of magnesium
(e) the balance tin, together with any unavoidable impurities.

Such an alloy has a low liquidus temperature and favourable thermal and mechanical properties.

The preferred silver, bismuth, indium contents of the first aspect of the present invention apply also to this aspect.

The alloy may comprise from 1 to 10 wt. % silver and/or from 0.5 to 10 wt. % bismuth and/or from 3.55 to 25 wt. % indium In a further embodiment, there is provided an alloy comprising 2.5 to 4 wt. % silver, from 2 to 4 wt. % bismuth, from 16 to 21 wt. % indium. Such an alloy has a liquidus temperature of 191.9° C. In one specific example of this embodiment, the alloy comprises approximately 3 wt. % silver, 3 wt. % bismuth, 20 wt. % indium and the balance tin together with unavoidable impurities.

In a further embodiment, there is provided an alloy comprising 2.5 to 4 wt. % silver, from 2 to 4 wt. % bismuth, from 22 to 25 wt. % indium. Such an alloy has a liquidus temperature of 183° C. In one specific example of this embodiment, the alloy comprises approximately 3 wt. % silver, 3 wt. % bismuth, 25 wt. % indium and the balance tin together with unavoidable impurities.

In a further embodiment, there is provided an alloy comprising 2.5 to 4 wt. % silver, from 2 to 4.5 wt. % bismuth, from 22 to 25 wt. % indium. Such an alloy has a liquidus temperature of 181.6° C. In one specific example of this embodiment, the alloy comprises approximately 3 wt. % silver, 4 wt. % bismuth, 25 wt. % indium and the balance tin together with unavoidable impurities.

In a further embodiment, there is provided an alloy comprising 2.5 to 4 wt. % silver, from 0.5 to 2 wt. % bismuth, from 12 to 15 wt. % indium. Such an alloy has a liquidus temperature of 201.1° C. In one specific example of this embodiment, the alloy comprises approximately 3 wt. % silver, 1 wt. % bismuth, 13 wt. % indium and the balance tin together with unavoidable impurities.

In a further embodiment, there is provided an alloy comprising 2.5 to 4 wt. % silver, from 2 to 4 wt. % bismuth, from 12 to 15 wt. % indium. Such an alloy has a liquidus temperature of 198.9° C. In one specific example of this embodiment, the alloy comprises approximately 3 wt. % silver, 3 wt. % bismuth, 14 wt. % indium and the balance tin together with unavoidable impurities.

In a further embodiment, there is provided an alloy comprising 3.5 to 6 wt. % silver, from 2 to 4 wt. % bismuth, from 10 to 14 wt. % indium. Such an alloy has a liquidus temperature of 203.2° C. In one specific example of this embodiment, the alloy comprises approximately 5 wt. % silver, 3 wt. % bismuth, 12 wt. % indium and the balance tin together with unavoidable impurities.

In a further embodiment, there is provided an alloy comprising 2.5 to 4 wt. % silver, from 7 to 10 wt. % bismuth, from 12 to 16 wt. % indium. Such an alloy has a liquidus temperature of 189.6° C. In one specific example of this embodiment, the alloy comprises approximately 3 wt. % silver, 10 wt. % bismuth, 15 wt. % indium and the balance tin together with unavoidable impurities.

In a further embodiment, there is provided an alloy comprising 2.5 to 4 wt. % silver, from 7 to 10 wt. % bismuth, from 7 to 10 wt. % indium and 0.1 to 1 wt. % copper. Such an alloy has a liquidus temperature of 195.6° C. In one specific example of this embodiment, the alloy comprises approximately 3 wt. % silver, 10 wt. % bismuth, 10 wt. % indium, 0.5 wt. % copper and the balance tin together with unavoidable impurities.

In a further embodiment, there is provided an alloy comprising 2.5 to 4 wt. % silver, from 3 to 6 wt. % bismuth, from 15 to 20 wt. % indium. Such an alloy has a liquidus temperature of 189.9° C. In one specific example of this embodiment, the alloy comprises approximately 3 wt. % silver, 1 wt. % bismuth, 20 wt. % indium, 0.5 wt. % copper and the balance tin together with unavoidable impurities.

In a further embodiment, there is provided an alloy comprising 2.5 to 4 wt. % silver, from 1 to 4 wt. % bismuth, from 10 to 15 wt. % indium, 1 to 2.5 wt. % gallium and the balance tin together with unavoidable impurities. Such an alloy has a liquidus temperature of 189.6° C. In one specific example of this embodiment, the alloy comprises approximately 3 wt. % silver, 3 wt. % bismuth, 15 wt. % indium, 2.0 wt. % gallium and the balance tin together with unavoidable impurities.

In a further embodiment, there is provided an alloy comprising 2.5 to 4 wt. % silver, from 2 to 6 wt. % bismuth, from 10 to 15 wt. % indium, 0 to 2 wt. % copper and the balance tin together with unavoidable impurities. Such an alloy has a liquidus temperature of 192.7° C. In one specific example of this embodiment, the alloy comprises approximately 3 wt. % silver, 5 wt. % bismuth, 15 wt. % indium, 0.5 wt. % copper and the balance tin together with unavoidable impurities.

In further embodiment, there is provided an alloy comprising 3 to 4 wt. % silver, from 8 to 10 wt. % bismuth, from 0.5 to 1.5 wt. % indium. Such an alloy has a liquidus temperature of 207° C. In one specific example of this embodiment, the alloy comprises approximately 3.6 wt. % silver, 8 wt. % bismuth, 1.5 wt. % indium and the balance tin together with unavoidable impurities.

In further embodiment, there is provided an alloy comprising 3 to 4 wt. % silver, from 5 to 8 wt. % bismuth, from 2 to 3 wt. % indium. Such an alloy has a liquidus temperature of 207° C. In one specific example of this embodiment, the alloy comprises approximately 3.6 wt. % silver, 8 wt. % bismuth, 2 wt. % indium and the balance tin together with unavoidable impurities.

In further embodiment, there is provided an alloy comprising 3.5 to 5 wt. % silver, from 7 to 9 wt. % bismuth, from 6 to 7 wt. % indium. Such an alloy has a liquidus temperature of 200° C. In one specific example of this embodiment, the alloy comprises approximately 3.5 wt. % silver, 7.6 wt. % bismuth, 6 wt. % indium and the balance tin together with unavoidable impurities.

In further embodiment, there is provided an alloy comprising 3 to 4 wt. % silver, from 8 to 10 wt. % bismuth, from 5 to 6 wt. % indium. Such an alloy has a liquidus temperature of 199° C. In one specific example of this embodiment, the alloy comprises approximately 3.5 wt. % silver, 10 wt. % bismuth, 5.6 wt. % indium and the balance tin together with unavoidable impurities.

In further embodiment, there is provided an alloy comprising 0.5 to 2 wt. % silver, from 10 to 12 wt. % bismuth, from 6 to 7 wt. % indium. Such an alloy has a liquidus temperature of 203° C. In one specific example of this embodiment, the alloy comprises approximately 1 wt. % silver, 10 wt. % bismuth, 6 wt. % indium and the balance tin together with unavoidable impurities.

In a further aspect, the present invention provides a lead-free, antimony-free solder alloy comprising:
(a) 10 wt. % or less of silver
(b) 30 wt. % or less of indium
(c) 3 wt. % or less copper
(d) optionally one or more of the following elements:
0 to 3 wt. % bismuth
0 to 1 wt. % nickel
0 to 1 wt. % of titanium
0 to 1 wt. % manganese
0 to 1 wt. % of rare earths, such as cerium
0 to 1 wt. % of chromium
0 to 1 wt. % germanium
0 to 1 wt. % of cobalt
0 to 1 wt. % of iron
0 to 1 wt. % of aluminum
0 to 1 wt. % of phosphorus
0 to 1 wt. % of gold
0 to 1 wt. % of tellurium
0 to 1 wt. % of selenium
0 to 1 wt. % of calcium
0 to 1 wt. % of vanadium
0 to 1 wt. % of molybdenum
0 to 1 wt. % of platinum
0 to 1 wt. % of magnesium
(e) the balance tin, together with any unavoidable impurities.

The preferred element contents of the first aspect may apply also to this aspect.

The alloy may comprise from 1 to 10 wt. % silver and/or from 3.55 to 30 wt. % indium and/or from 0.1 to 3 wt. % copper.

In one embodiment, there is provided an alloy comprising from 2.5 to 4 wt. % silver, from 22 to 25 wt % indium and 0.1 to 1 wt. % copper. Such an alloy has a liquidus temperature of 183.5° C. In one specific example of this embodiment, the alloy comprises approximately 3 wt. % silver, 25 wt. % indium, 0.5 wt. % copper and the balance tin together with unavoidable impurities.

In a further embodiment, there is provided an alloy comprising 2.5 to 4 wt. % silver, from 16 to 21 wt. % indium, 0.1 to 1 wt. % copper. Such an alloy has a liquidus temperature of 190.6° C., In one specific example of this embodiment, the alloy comprises approximately 3 wt. % silver, 20 wt. % indium, 0.6 wt. % copper and the balance tin together with unavoidable impurities.

In a further aspect, the present invention provides a lead-free, antimony-free solder alloy comprising:
(a) 10 wt. % or less of silver
(b) 10 wt. % or less of bismuth
(b) 8 wt. % or less of indium
(c) 3 wt. % or less copper
(d) 1 wt. % or less of phosphorus
(d) optionally one or more of the following elements:
0 to 1 wt. % nickel
0 to 1 wt. % of titanium
0 to 1 wt. % manganese
0 to 1 wt. % of rare earths, such as cerium
0 to 1 wt. % of chromium
0 to 1 wt. % germanium
0 to 1 wt. % of cobalt
0 to 1 wt. % of iron
0 to 1 wt. % of aluminum
0 to 1 wt. % of gold
0 to 1 wt. % of tellurium
0 to 1 wt. % of selenium
0 to 1 wt. % of calcium
0 to 1 wt. % of vanadium
0 to 1 wt. % of molybdenum
0 to 1 wt. % of platinum
0 to 1 wt. % of magnesium
(e) the balance tin, together with any unavoidable impurities The preferred element contents of the first aspect may apply also to this aspect.

The alloy may comprise from 1 to 10 wt. % silver and/or from 0.5 to 10 wt. % bismuth and/or from 3.55 to 8 wt. % indium and/or from 0.1 to 3 wt. % copper and/or from 0.01 to 1 wt. % or less of phosphorus.

In one embodiment, there is provided an alloy comprising from 2.5 to 4 wt. % silver, from 2.5 to 4 wt. % bismuth, from 5 to 8 wt % indium, 0.1 to 1 wt. % copper, from 0.05 to 0.3 wt. % nickel, from 0.001 to 0.05 wt. % manganese, from 0.001 to 0.1 wt. % phosphorus. Such an alloy has a liquidus temperature of 183.5° C. In one specific example of this embodiment, the alloy comprises approximately 3 wt. % silver, 3 wt. % bismuth, 0.6 wt. % copper, 6 wt. % indium, 0.19 wt. % nickel, 0.02 wt. % manganese, 0.08 wt. % phosphorus and the balance tin together with unavoidable impurities.

The alloys described herein may consist essentially of the recited elements. It will therefore be appreciated that in addition to those elements that are mandatory other non-specified elements may be present in the composition provided that the essential characteristics of the composition are not materially affected by their presence.

The alloys may be in the form of, for example, a bar, a stick, a solid or flux cored wire, a foil or strip, or a powder or paste (powder plus flux blend), or solder spheres for use in ball grid array joints or chip scale packages, or other pre-formed solder pieces, with or without a flux core or a flux coating.

In a further aspect, the present invention provides a soldered joint comprising an alloy as described herein.

In a further aspect, the present invention provides a method of forming a solder joint comprising:
(i) providing two or more work pieces to be joined;
(ii) providing a solder alloy as described herein; and
(iii) heating the solder alloy in the vicinity of the work pieces to be joined.

In a further aspect, the present invention provides the use of an alloy composition as described herein in a soldering method such as wave soldering, Surface Mount Technology (SMT) soldering, die attach soldering, thermal interface soldering, hand soldering, laser and RF induction soldering, soldering to a solar module, soldering of level 2 LED package boards, and rework soldering.

The present invention will now be described further, by way of few non-limiting examples of these alloys and a summary of their performance.

Referring to FIG. 1, The hardness of the alloys varies between 25-30 Hv except for alloy E that is 35 Hv. That is, the increase in hardness of the alloys ranges from 67 to 100% as compared to SnAg3.0Cu0.5. Hardness of Alloy E is 133% greater than that of SnAg3.0Cu0.5.

Figure 2:
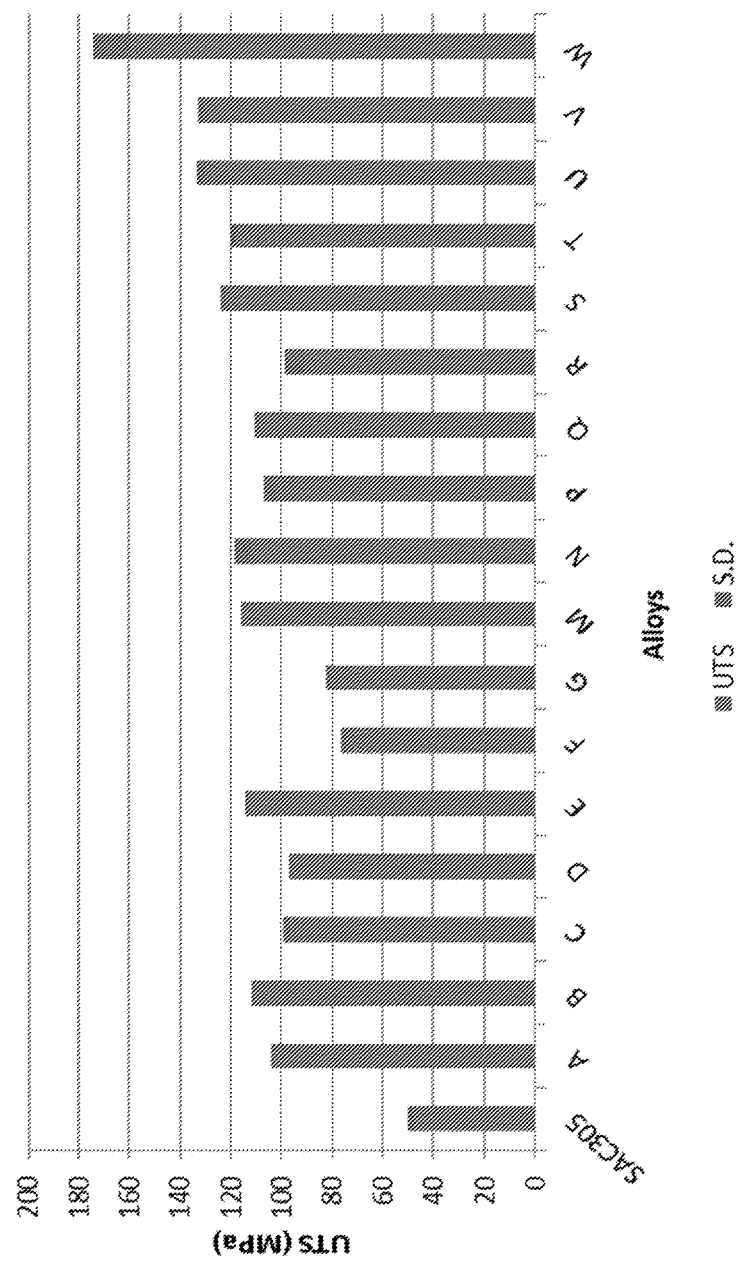
FIG. 2 shows ultimate tensile strengths (UTS) for a prior art alloy and alloys according to the present invention.
Figure 3:
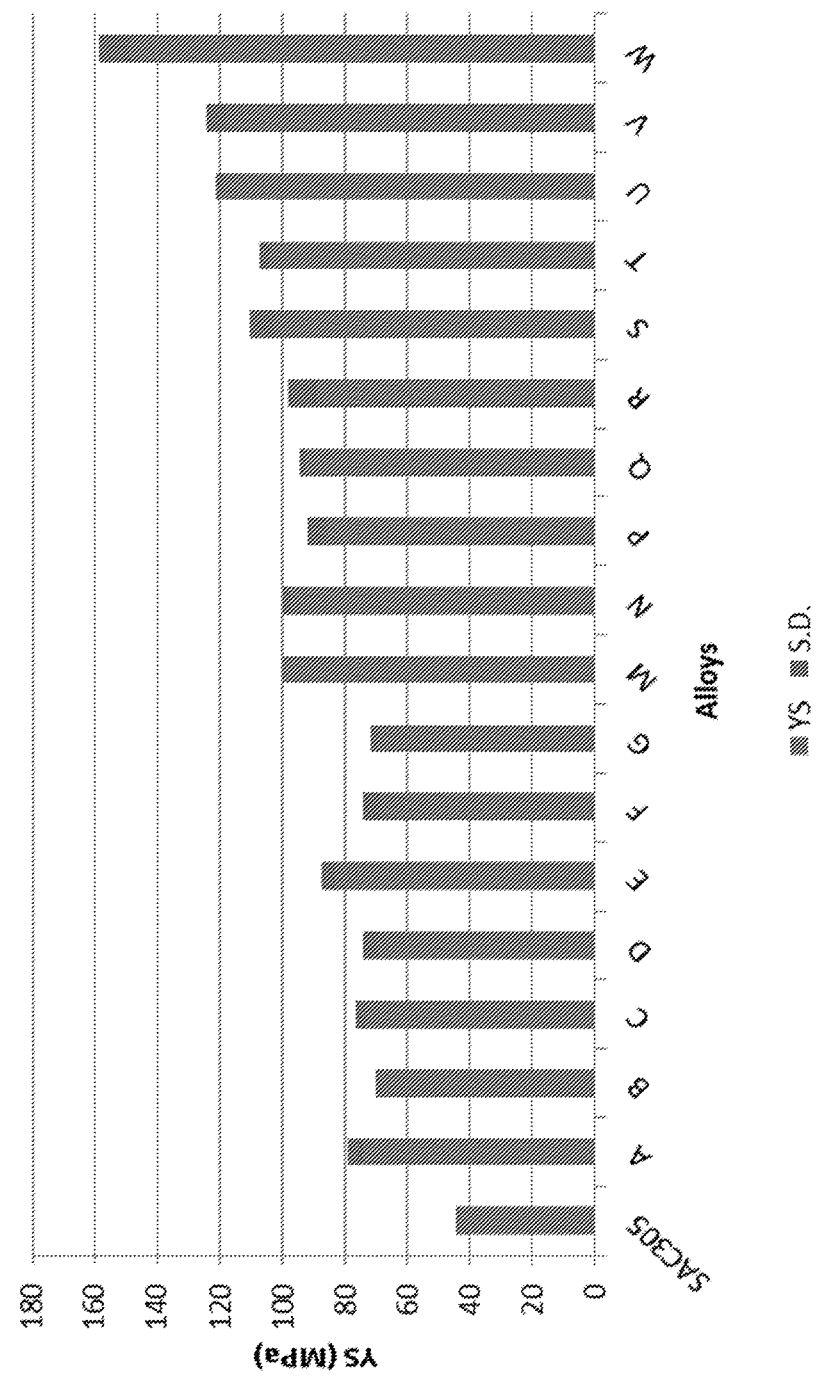
FIG. 3 shows yield strengths (YS) for a prior art alloy and alloys according to the present invention.

The ultimate tensile strengths (UTS) and yield strengths (YS) are shown in FIGS. 2 and 3, respectively (see ASTM E8/ESM-09 for test methods of tensile measurements). The UTS increases at least 53% in alloy F and up to 137% in alloy M. The YS increases at least 41% in alloy D and up to 104% in alloy M.

The present invention will now be described further with reference to the following non-limiting examples.

Example 1—Alloy A

Alloy A comprises 3.5 wt. % silver, 4 wt. % bismuth, 0.7 wt. % copper, 3.7 wt. % indium, from 0.2 wt. % nickel and the balance tin together with unavoidable impurities. Alloy A has solidus and liquidus temperatures of 196.4 and 209.2° C., respectively, and a Vickers Hardness (Hv-1) of 31. For comparison purposes, the conventional alloy, SnAg3.0Cu0.5, has a melting range of 217.3 to 223.5° C.; and a Vickers Hardness (Hv-0.5) of 15.

Example 2—Alloy B

Alloy B comprises approximately 3 wt. % silver, 5 wt. % bismuth, 0.7 wt. % copper, 3.75 wt. % indium, 0.1 wt. % nickel and the balance tin together with unavoidable impurities. Alloy B has a melting range of 197.4 and 208.1° C.; and Vickers Hardness (Hy-1) of 30.

Example 3—Alloy C

Alloy C comprises 1.5 wt. % silver, 5 wt. % bismuth, 0.7 wt. % copper, 3.75 wt. % indium, 0.16 wt. % nickel and the balance tin together with unavoidable impurities. Alloy C has a melting range of 191 to 215° C.; and Vickers Hardness (Hy-1) of 29.

Example 4—Alloy D

Alloy D comprises 1.02 wt. % silver, 3.67 wt. % bismuth, 0.68 wt. % copper, 3.5 wt. % indium, 0.12 wt. % nickel, 0.9 wt. % gallium and the balance tin together with unavoidable impurities. Alloy D has a melting range of 190.6 to 212.9° C.; and Vickers Hardness (Hv-1) of 27.

Example 5—Alloy E

Alloy E comprises 3 wt. % silver, 4 wt. % bismuth, 0.7 wt. % copper, 2.94 wt. % indium, 0.2 wt. % nickel, 1.14 wt. % gallium and the balance tin together with unavoidable impurities. Alloy E has a melting range of 196.7 to 206.9° C.; and Vickers Hardness (Hy-1) of 36. The presence of higher gallium results in higher hardness of this alloy as compared to alloy D.

Example 6—Alloy F

Alloy F comprises 3 wt. % silver, 0.9 wt. % bismuth, 0.5 wt. % copper, 3.6 wt. % indium, and the balance tin together with unavoidable impurities. Alloy F has a melting range of 206.2 to 213° C.; and Vickers Hardness (Hv-1) of 24. In this case, lower bismuth (solid solution hardening) and absence of nickel (precipitation hardening) results in lower hardness of the alloy.

Example 7—Alloy H

Alloy H comprises 3 wt. % silver, 1 wt. % bismuth, 0.5 wt. % copper, 4.6 wt. % indium, 0.11 wt. % nickel, and the balance tin together with unavoidable impurities. Alloy H has a melting range of 204 to 210.5° C.

Example 8—Alloy K

Alloy K comprises 3 wt. % silver, 3 wt. % bismuth, 0.5 wt. % copper, 4 wt. % indium, 0.2 wt. % nickel, and the balance tin together with unavoidable impurities. Alloy K has a melting range of 196.4 to 210.2° C.

Example 9—Alloy L

Alloy L comprises 3 wt. % silver, 2.9 wt. % bismuth, 0.5 wt. % copper, 4.75 wt. % indium, 0.11 wt. % nickel, and the balance tin together with unavoidable impurities. Alloy L has a melting range of 1966 to 207.9° C.

Example 10—Alloy M

Alloy M comprises 3 wt. % silver, 3 wt. % bismuth, 0.5 wt. % copper, 6 wt. % indium, 0.1 wt. % nickel, and the balance tin together with unavoidable impurities. Alloy M has a melting range of 196.1 to 206.5° C.

Example 11—Alloy N

Alloy N comprises 3 wt. % silver, 3 wt. % bismuth, 0.5 wt. % copper, 6 wt. % indium, 0.15 wt. % nickel, 0.022 wt. % manganese and the balance tin together with unavoidable impurities. Alloy N has a melting range 195.3 to 207.6° C.

Example 12—Alloy P

Alloy P comprises 3 wt. % silver, 3 wt. % bismuth, 0.5 wt. % copper, 6 wt. % indium, 0.2 wt. % nickel, 0.02 wt. % titanium and the balance tin together with unavoidable impurities. Alloy P has a melting range of 196.7 to 206.8° C.

Example 13—Alloy Q

Alloy Q comprises 3 wt. % silver, 3 wt. % bismuth, 0.5 wt. % copper, 6 wt. % indium, 0.2 wt. % nickel, 0.04 wt. % cerium and the balance tin together with unavoidable impurities. Alloy Q has a melting range of 198.8 to 207.2° C.

Example 14—Alloy R

Alloy R comprises 3 wt. % silver, 1 wt. % bismuth, 0.6 wt. % copper, 8 wt. % indium and the balance tin together with unavoidable impurities. Alloy R has a melting range from 196.5 to 205.8° C.

Example 15—Alloy S

Alloy S comprises 3 wt. % silver, 1 wt. % bismuth, 0.6 wt. % copper, 1.55 wt. % gallium, 5 wt. % indium and the balance tin together with unavoidable impurities. Alloy S has a melting range from 198.3 to 207.2° C.

Example 16—Alloy T

Alloy T comprises 3.8 wt. % silver, 3 wt. % bismuth, 0.6 wt. % copper, 8 wt. % indium, 0.2 wt. % nickel and the balance tin together with unavoidable impurities. Alloy T has a melting range from 190.5 to 203.5° C.

Example 17—Alloy U

Alloy U comprises 3 wt. % silver, 3 wt. % bismuth, 0.6 wt. % copper, 8 wt. % indium, 0.02 wt. % titanium and the balance tin together with unavoidable impurities. Alloy U has a melting range from 191.9 to 203.2° C.

Example 18—Alloy V

Alloy V comprises 3 wt. % silver, 3 wt. % bismuth, 0.6 wt. % copper, 10 wt. % indium, 0.02 wt. % manganese and the balance tin together with unavoidable impurities. Alloy V has a melting range from 186.8 to 199.5° C.

Example 19—Alloy W

Alloy W comprises 3.8 wt. % silver, 3 wt. % bismuth, 2 wt. % gallium, 8 wt. % indium and the balance tin together with unavoidable impurities. Alloy W has a melting range from 176.8 to 199.6° C.

Example 20—Alloy X

Alloy X comprises 3 wt. % silver, 3 wt. % bismuth, 12 wt. % indium, 0.6 wt. % copper and the balance tin together with unavoidable impurities. Alloy X has a melting range from 179 to 196° C.

Example 21—Alloy Y

Alloy Y comprises 2 wt. % silver, 3 wt. % bismuth, 10 wt. % indium, 0.7 wt. % copper and the balance tin together with unavoidable impurities. Alloy Y has a melting range from 178 to 202° C.

Example 22—Alloy Z

Alloy Z comprises 2 wt. % silver, 3 wt. % bismuth, 8 wt. % indium, 1 wt. % gallium and the balance tin together with unavoidable impurities. Alloy Y has a melting range from 175 to 203° C.

Example 23—Alloy A1

Alloy A1 comprises 3 wt. % silver, 3 wt. % bismuth, 20 wt. % indium and the balance tin together with unavoidable impurities. Alloy A1 has a melting range from 132.5 to 191.9° C.

Example 24—Alloy A2

Alloy A2 comprises of 3 wt. % silver, 3 wt. % bismuth, 25 wt. % indium and the balance tin together with unavoidable impurities. Alloy A2 has a melting range from 120.9 to 183° C.

Example 25—Alloy A3

Alloy A3 comprises of 3 wt. % silver, 4 wt. % bismuth, 25 wt. % indium and the balance tin together with unavoidable impurities. Alloy A3 has a melting range from 113.7 to 181.6° C.

Example 26—Alloy A4

Alloy A4 comprises of 3 wt. % silver, 1 wt. % bismuth, 13 wt. % indium and the balance tin together with unavoidable impurities. Alloy A4 has a melting range from 170 to 201.1° C.

Example 27—Alloy A5

Alloy A5 comprises of 3 wt. % silver, 3 wt. % bismuth, 14 wt. % indium and the balance tin together with unavoidable impurities. Alloy A5 has a melting range from 152.9 to 198.9° C.

Example 28—Alloy A6

Alloy A6 comprises of 5 wt. % silver, 3 wt. % bismuth, 12 wt. % indium and the balance tin together with unavoidable impurities. Alloy A6 has a melting range from 157 to 203.2° C.

Example 29—Alloy A7

Alloy A7 comprises of 3 wt. % silver, 10 wt. % bismuth, 10 wt. % indium, 0.5 wt. % copper and the balance tin together with unavoidable impurities. Alloy A7 has a melting range from 144.9 to 195.6° C.

Example 30—Alloy A8

Alloy A8 comprises of 3 wt. % silver, 10 wt. % bismuth, 15 wt. % indium and the balance tin together with unavoidable impurities. Alloy A8 has a melting range from 123 to 189.6° C.

Example 31—Alloy A9

Alloy A9 comprises of 3 wt. % silver, 10 wt. % bismuth, 15 wt. % indium and the balance tin together with unavoidable impurities. Alloy A9 has a melting range from 138.5 to 189.9° C.

Example 32—Alloy A10

Alloy A10 comprises of 3 wt. % silver, 3 wt. % bismuth, 2 wt. % gallium, 15 wt. % indium and the balance tin together with unavoidable impurities. Alloy A10 has a melting range from 128.4 to 189.6° C.

Example 33—Alloy A11

Alloy A11 comprises of 3 wt. % silver, 5 wt. % bismuth, 15 wt. % indium, 0.5 wt. % copper and the balance tin together with unavoidable impurities. Alloy A11 has a melting range from 132.8 to 192.7° C.

Example 34—Alloy A12

Alloy A12 comprises of 3 wt. % silver, 25 wt. % indium, 0.5 wt. % copper and the balance tin together with unavoidable impurities. Alloy A12 has a melting range from 139.7 to 183.5° C.

Example 35—Alloy A13

Alloy A13 comprises of 3 wt. % silver, 20 wt. % indium, 0.6 wt. % copper and the balance tin together with unavoidable impurities. Alloy A13 has a melting range from 144.6 to 190.6° C.

Example 36—Alloy B1

Alloy B1 comprises of 3.6 wt. % silver, 4 wt. % bismuth, 4 wt. % indium, 0.4 wt. % copper, 0.01% manganese and the balance tin together with unavoidable impurities. Alloy B1 has a melting range of 186 to 208° C.

Example 37—Alloy B2

Alloy B2 comprises of 3.6 wt. % silver, 3 wt. % bismuth, 6 wt. % indium, 0.4 wt. % copper, 0.03 wt. % cobalt and the balance tin together with unavoidable impurities. Alloy B2 has a melting range of 187 to 208° C.

Example 38—Alloy B3

Alloy B3 comprises of 3.5 wt. % silver, 4 wt. % bismuth, 8 wt. % indium, 0.4 wt. % copper, 0.01 wt. % manganese and the balance tin together with unavoidable impurities. Alloy 33 has a melting range of 182 to 201° C.

Example 39—Alloy B4

Alloy B4 comprises of 3.6 wt. % silver, 8 wt. % bismuth, 1.5 wt. % indium, 0.4 wt. % copper, 0.03 wt. % cobalt and the balance tin together with unavoidable impurities. Alloy B4 has a melting range of 187 to 207° C.

Example 40—Alloy B5

Alloy B5 comprises of 3.6 wt. % silver, 8 wt. % bismuth, 2 wt. % indium, 0.4 wt. % copper, 0.01 wt. % manganese and the balance tin together with unavoidable impurities. Alloy 35 has a melting range of 184 to 207° C.

Example 41—Alloy B6

Alloy 36 comprises of 3.5 wt. % silver, 7.6 wt. % bismuth, 6 wt. % indium, 0.4 wt. % copper, 0.01 wt. % manganese and the balance tin together with unavoidable impurities. Alloy B6 has a melting range of 176 to 200° C.

Example 42—Alloy B7

Alloy B7 comprises of 3.3 wt. % silver, 10 wt. % bismuth, 5.6 wt. % indium, 0.4 wt. % copper, 0.03 wt. % cobalt and the balance tin together with unavoidable impurities. Alloy B6 has a melting range of 174 to 199° C.

Example 43—Alloy B8

Alloy B8 comprises of 1 wt. % silver, 10 wt. % bismuth, 6 wt. % indium, 0.125 wt. % copper, 0.03 wt. % cobalt and the balance tin together with unavoidable impurities. Alloy B6 has a melting range of 176 to 203° C.

Example 44—Alloy B9

Alloy B9 comprises of 3 wt. % silver, 3 wt. % bismuth, 6 wt. % indium, 0.6 wt. % copper, 0.19 wt. % nickel, 0.02 wt. % manganese, 0.08 wt. % phosphorus and the balance tin together with unavoidable impurities. Alloy B6 has a melting range of 190.6 to 207.1° C.

Example 45—Alloy B10

Alloy B10 comprises of 2.9 wt. % silver, 3 wt. % bismuth, 6 wt. % indium, 0.5 wt. % copper, 0.12 wt. % nickel, 0.008 wt. % germanium and the balance tin together with unavoidable impurities. Alloy B6 has a melting range of 189.9 to 207.1° C.

Table 1 shows the solidus and liquidus temperatures of the conventional SnAg3.0Cu0.5 alloy and Alloys A-W and A1 to A13. The melting temperatures of all the alloys are substantially lower than the conventional SnAg3.0Cu0.5 alloy.

TABLE 1

Solidus and Liquidus Temperatures of all the alloys

| Alloys | Solidus Temperature (° C.) | Liquidus Temperature (° C.) |
| --- | --- | --- |
| SnAg3.0Cu0.5 | 217.3 | 223.5 |
| A | 196.4 | 209.2 |
| B | 197.4 | 208.1 |
| C | 191 | 215 |
| D | 190.6 | 212.9 |
| E | 196.7 | 206.9 |
| F | 206.2 | 213 |
| H | 204 | 210.5 |
| K | 196.4 | 210.2 |
| L | 196.6 | 207.9 |
| M | 196.1 | 206.5 |
| N | 195.3 | 207.6 |
| P | 196.7 | 206.8 |
| Q | 198.8 | 207.2 |
| R | 196.5 | 205.8 |
| S | 198.3 | 207.2 |
| T | 190.5 | 203.5 |
| U | 191.9 | 203.2 |
| V | 186.8 | 199.5 |
| W | 176.8 | 199.6 |
| X | 179 | 196 |
| Y | 178 | 202 |
| Z | 175 | 203 |
| A1 | 132.5 | 191.9 |
| A2 | 120.9 | 183 |
| A3 | 113.7 | 181.6 |
| A4 | 170 | 201.1 |
| A5 | 152.9 | 198.9 |
| A6 | 157 | 203.2 |
| A7 | 144.9 | 195.6 |
| A8 | 123 | 189.6 |
| A9 | 138.5 | 189.9 |
| A10 | 128.4 | 189.6 |
| A11 | 132.8 | 192.7 |
| A12 | 139.7 | 183.5 |
| A13 | 144.6 | 190.6 |
| B1 | 186 | 208 |
| B2 | 187 | 208 |
| B3 | 182 | 201 |
| B4 | 187 | 207 |
| B5 | 184 | 207 |
| B6 | 176 | 200 |
| B7 | 174 | 199 |
| B8 | 176 | 203 |
| B9 | 190.6 | 207.1 |
| B10 | 189.9 | 207.1 |

Figure 4:
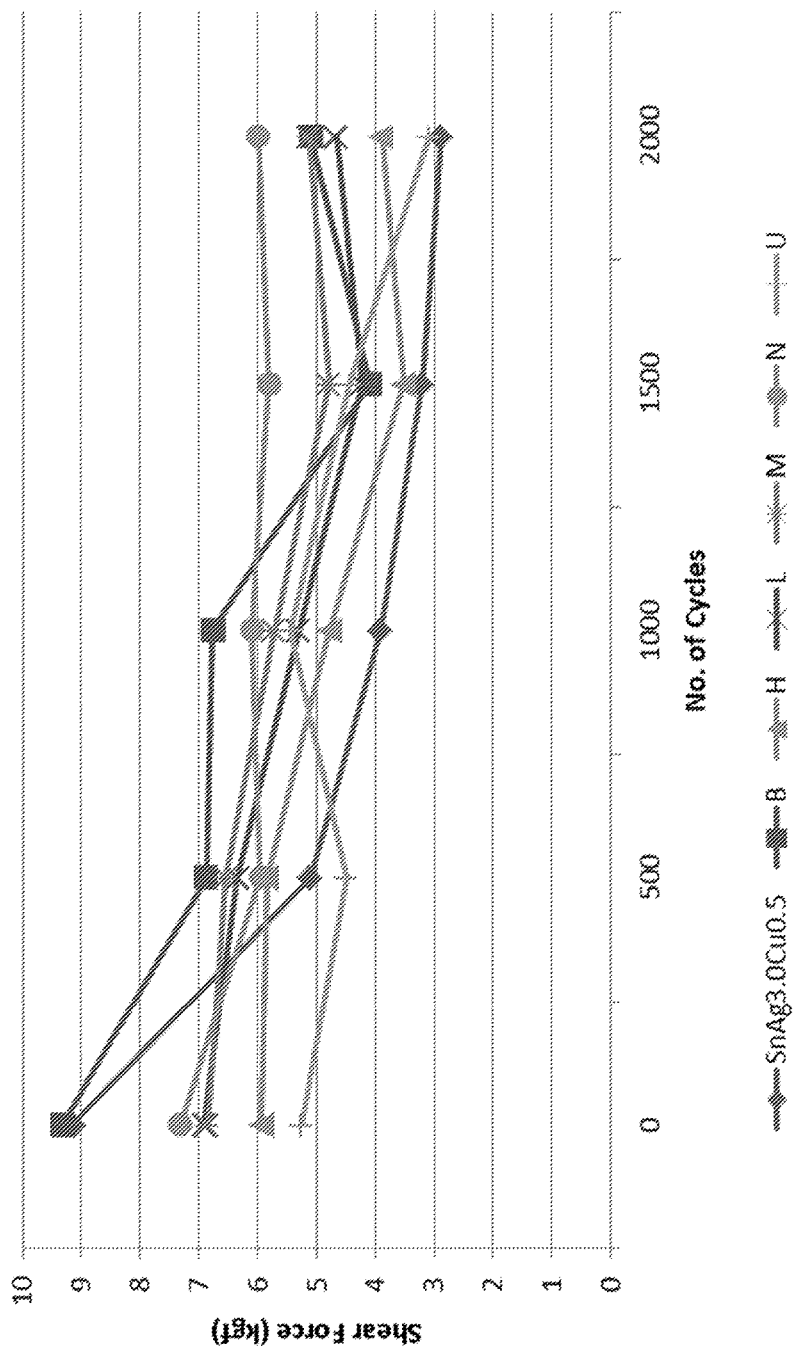
FIG. 4 shows the results of thermal cycling testing.

FIG. 4 shows the effect of thermal cycling on the shear strength of the chip resistors, CR1206. During thermal cycling, the conventional SnAg3.0Cu0.5 alloy undergoes 68% loss in shear strength as compared to 18 and 25% loss for the alloys N and M, respectively. Results of the thermal cycling tests are shown in Table 2.

TABLE 2

Results of thermal cycling tests

| Alloys | % failure up to 500 cycles | % failure up to 1000 cycles | % failure up to 1500 cycles | % failure up to 2000 cycles |
| --- | --- | --- | --- | --- |
| SnAg3.0Cu0.5 | Nil | Nil | 2.2 | 4.4 |
| B | Nil | Nil | Nil | 2.2 |
| H | Nil | Nil | Nil | Nil |
| L | Nil | Nil | Nil | 2.2 |
| M | Nil | Nil | Nil | Nil |
| N | Nil | Nil | Nil | Nil |
| U | Nil | Nil | Nil | Nil |
| V | Nil | Nil | Nil | Nil |

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

The invention claimed is:

1. A lead-free, antimony-free solder alloy consisting of:
 (a) from 1 to 4 wt. % silver
 (b) from 0.5 to 6 wt. % bismuth
 (c) from 7 to 12 wt % indium
 (d) from 0.01 to 3 wt % copper
 (e) from 0.005 to 1 wt. % of titanium
 (f) one or more of the following elements
  0 to 1 wt. % nickel
  0 to 1 wt. % manganese
  0 to 1 wt. % of rare earths, such as cerium
  0 to 1 wt. % of chromium
  0 to 1 wt. % germanium
  0 to 1 wt. % of gallium
  0 to 1 wt. % of cobalt
  0 to 1 wt. % of iron
  0 to 1 wt. % of aluminum
  0 to 1 wt. % of phosphorus
  0 to 1 wt. % of gold
  0 to 1 wt. % of tellurium
  0 to 1 wt. % of selenium
  0 to 1 wt. % of calcium
  0 to 1 wt. % of vanadium
  0 to 1 wt. % of molybdenum
  0 to 1 wt. % of platinum
  0 to 1 wt. % of magnesium
 (g) the balance tin, together with any unavoidable impurities.

2. The solder alloy according to claim 1, wherein the alloy comprises from 1.2 to 3.8 wt. % silver.

3. The solder alloy according to claim 1, wherein the alloy comprises from 2 to 4 wt. % silver, from 1 to 6 wt. % bismuth and from 7 to 10 wt. % indium.

4. The solder alloy according to claim 1, wherein the alloy comprises from 2.5 to 4 wt. % silver, from 2 to 4 wt. % bismuth, from 7 to 9 wt. % indium and from 0.1 to 1.5 wt. % copper.

5. The solder alloy according to claim 1, wherein the alloy comprises from 2.5 to 3.5 wt. % silver, from 2.5 to 3.5 wt. % bismuth, from 7 to 9 wt, % indium, from 0.3 to 0.8 wt. % copper and from 0.01 to 0.05 wt. % titanium.

6. The solder alloy according to claim 1, wherein the alloy comprises from 2.5 to 3.5 wt. % silver, from 2.5 to 3.5 wt. % bismuth, from 7 to 9 wt. % indium, from 0.3 to 0.8 wt. % copper, from 0.005 to 0.05 wt. % titanium and from 0.005 to 1 wt. % germanium.

7. The solder alloy according to claim 1, wherein the alloy comprises from 2.5 to 3.5 wt. % silver, from 2.5 to 3.5 wt. % bismuth, from 7 to 9 wt. % indium, from 0.3 to 0.7 wt. % copper, and from 0.001 to 0.03 wt. % germanium.

8. The solder alloy as claimed in claim 1, wherein the alloy has a liquidus temperature of 215° C. or less.

9. A method of forming a solder joint comprising:
 (i) providing two or more work pieces to be joined;
 (ii) providing a solder alloy consisting of:
  (a) from 1 to 4 wt. % silver
  (b) from 0.5 to 6 wt. % bismuth
  (c) from 7 to 12 wt. % indium
  (d) from 0.01 to 3 wt. % or less of copper
  (e) from 0.005 to 1 wt. % of titanium
  (f) one or more of the following elements:
   0 to 1 wt. % nickel
   0 to 1 wt. % of titanium
   0 to 1 wt. % manganese
   0 to 1 wt. % of rare earths, such as cerium
   0 to 1 wt. % of chromium
   0 to 1 wt. % germanium
   0 to 1 wt. % of gallium
   0 to 1 wt. % of cobalt
   0 to 1 wt. % of iron
   0 to 1 wt. % of aluminum
   0 to 1 wt. % of phosphorus
   0 to 1 wt. % of gold
   0 to 1 wt. % of tellurium
   0 to 1 wt. % of selenium
   0 to 1 wt. % of calcium
   0 to 1 wt. % of vanadium
   0 to 1 wt. % of molybdenum
   0 to 1 wt. % of platinum
   0 to 1 wt. % of magnesium
  (g) the balance tin, together with any unavoidable impurities; and
 (iii) heating the solder alloy in the vicinity of the work pieces to be joined.

10. A lead-free, antimony-free solder alloy consisting of:
 (a) from 1 to 4 wt. % silver;
 (b) from 0.5 to 6 wt. % bismuth;
 (c) from 4.5 to 10 wt. % indium;
 (d) from 0.01 to 3 wt. % copper;
 (e) from 0.05 to 0.25 wt. % of nickel;
 (f) from 0.01 to 0.05 wt. % manganese;
 (g) optionally, from 0.005 to 1.0 wt. % phosphorus;
and the balance tin, together with any unavoidable impurities.

11. The solder alloy according to claim 10, wherein the alloy comprises from 2 to 4 wt. % silver, from 2 to 4.5 wt. % bismuth, from 4.5 to 10 wt. % indium, from 0.1 to 1.5 wt. % of copper and from 0.05 to 0.25 wt. % of nickel.

12. The solder alloy according to claim 10, wherein the alloy comprises from 2.5 to 4 wt. % silver, from 2 to 4 wt. % bismuth, from 5 to 8 wt. % indium, from 0.1 to 1.5 wt. % copper and from 0.05 to 0.25 wt. % of nickel.

13. The solder alloy according to claim 12, wherein the alloy comprises from 2.5-3.5 wt. % silver, from 2.5 to 3.5 wt. % bismuth, from 5.5 to 6.5 wt. % indium, from 0.1 to 1.5 wt. % copper and from 0.05 to 0.25 wt. % nickel.

14. The solder alloy according to claim 10, wherein the alloy comprises from 2.5 to 4 wt. % of silver, from 2.5 to 4 wt. % bismuth, from 5 to 6.5 wt. % indium, from 0.1 to 1.5 wt. % copper and from 0.05 to 0.25 wt. % of nickel.

15. The solder alloy according to claim 14, wherein the alloy comprises from 2.5 to 4 wt. % silver, from 2.5 to 4 wt. % bismuth, from 5.5 to 6.5 wt. % indium, from 0.1 to 1.5 wt. % copper and from 0.05 to 0.25 wt. % nickel.

16. The solder alloy according to claim 15, wherein the alloy comprises from 2.5 to 4 wt. % silver, from 2.5 to 4 wt. % bismuth, 6 wt. % indium, from 0.1 to 1.5 wt. % copper and from 0.05 to 0.25 wt. % nickel.

17. The solder alloy according to claim 10, wherein the alloy comprises from 2.5 to 4 wt. % silver, from 2.5 to 4 wt. % bismuth, from 5 to 6.5 wt. % indium, from 0.1 to 1.5 wt. % copper, from 0.05 to 0.25 wt. % nickel and from 0.01 to 0.05 wt. % manganese.

18. The solder alloy according to claim 17, wherein the alloy comprises from 2.5 to 3.5 wt. % silver, from 2.5 to 3.5 wt. % bismuth, from 5.5 to 6.5 wt. indium, from 0.3 to 0.7 wt. % copper, from 0.05 to 0.25 wt. % nickel and from 0.005 to 0.05 wt. % manganese.

19. The solder alloy according to claim 10, wherein the alloy comprises from 2.5 to 3.5 wt. % silver, from 2.5 to 3.5 wt. % bismuth, from 5.5 to 6.5 wt. % indium, from 0.3 to 0.8 wt. % copper, from 0.05 to 0.4 wt. % nickel, from 0.01 to 0.05 wt. % manganese and from 0.01 to 0.15 wt % phosphorous.

20. The solder alloy according to claim 10 comprising:
(a) 4.5 to 8 wt. % of indium; and
(b) from 0.005 to 1 wt. % phosphorus.

21. The solder alloy of claim 20 comprising from 2 to 4 wt. % silver, from 2 to 4 wt. % bismuth, from 0.1 to 0.8 wt. % copper and from 0.01 to 1 wt. % phosphorus.

* * * * *